(12) United States Patent
Ghoshal

(10) Patent No.: US 6,712,258 B2
(45) Date of Patent: Mar. 30, 2004

(54) INTEGRATED QUANTUM COLD POINT COOLERS

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/015,237

(22) Filed: Dec. 13, 2001

(65) Prior Publication Data

US 2003/0111516 A1 Jun. 19, 2003

(51) Int. Cl.[7] ................................................. B23K 1/00
(52) U.S. Cl. ..................................................... 228/134
(58) Field of Search ........................... 228/134; 136/201, 136/203; 62/32

(56) References Cited

U.S. PATENT DOCUMENTS

| | | | | |
|---|---|---|---|---|
| 3,779,446 | A | * 12/1973 | Lemelson ................... | 228/15.1 |
| 3,808,670 | A | * 5/1974 | Seetoo et al. ............. | 228/123.1 |
| 3,879,838 | A | * 4/1975 | Miller ....................... | 228/123.1 |
| 3,958,324 | A | * 5/1976 | Alais et al. .................. | 136/203 |
| 5,130,276 | A | 7/1992 | Adams et al. .............. | 437/225 |
| 5,279,128 | A | 1/1994 | Tomatsu et al. ............. | 62/3.4 |
| 5,651,495 | A | * 7/1997 | Tocher et al. ............ | 228/123.1 |
| 5,864,087 | A | * 1/1999 | Amano et al. .............. | 136/225 |
| 5,867,990 | A | 2/1999 | Ghoshal ....................... | 62/3.7 |
| 5,966,941 | A | 10/1999 | Ghoshal ....................... | 62/3.7 |
| 6,000,225 | A | 12/1999 | Ghoshal ....................... | 62/3.7 |
| 6,065,293 | A | * 5/2000 | Ghoshal ....................... | 62/3.2 |
| 6,161,388 | A | 12/2000 | Ghoshal ....................... | 62/3.7 |
| 6,222,113 | B1 | * 4/2001 | Ghoshal ...................... | 136/201 |
| 6,347,521 | B1 | * 2/2002 | Kadotani et al. ............. | 62/3.7 |
| 6,369,314 | B1 | * 4/2002 | Nolas ......................... | 136/201 |
| 6,384,312 | B1 | * 5/2002 | Ghoshal et al. ............. | 136/203 |
| 6,403,876 | B1 | * 6/2002 | Ghoshal et al. ............. | 136/205 |
| 6,467,275 | B1 | * 10/2002 | Ghoshal ........................ | 62/3.3 |
| 6,467,951 | B1 | * 10/2002 | Ghoshal ....................... | 374/45 |
| 6,474,074 | B2 | * 11/2002 | Ghoshal ....................... | 62/3.7 |
| 6,494,048 | B1 | * 12/2002 | Ghoshal et al. ............... | 62/3.7 |
| 2002/0092557 | A1 | * 7/2002 | Ghoshal ..................... | 136/201 |
| 2002/0166839 | A1 | * 11/2002 | Ghoshal et al. ............... | 216/11 |

FOREIGN PATENT DOCUMENTS

| | | | |
|---|---|---|---|
| EP | 0 667 498 A1 | 8/1995 | ........... F25B/21/02 |
| JP | 05039966 | 2/1993 | ........... F25B/21/02 |
| JP | 05172424 | 7/1993 | ........... F25B/21/02 |
| WO | WO 94/28364 | 12/1994 | ........... F25B/21/02 |
| WO | WO 00/08693 | 2/2000 | ........... H01L/35/34 |

OTHER PUBLICATIONS

Dresselhaus et al; Low–dimenstional thermoelectric materials: May 1999; vol. 41, No. 5; pp. 679–682.*

Rinzler et al., "Large–Scale Purification of Single–Wall Carbon Nanotubes: Process, Product, and Characterization", Applied Physics A, 1998, pp. 29–37.

(List continued on next page.)

*Primary Examiner*—Tom Dunn
*Assistant Examiner*—Colleen P Cooke
(74) *Attorney, Agent, or Firm*—Duke W. Yee; Casimer K. Salys; Patrick C. R. Holmes

(57) ABSTRACT

A method for forming a thermoelement for a thermoelectric cooler is provided. In one embodiment a first substrate having a plurality of pointed tips separated by valleys wherein the substrate is covered by a metallic layer, portions of the metallic layer are covered by an insulator, and other portions of the metallic layer are exposed is formed. The other portions of the metallic layer that are exposed are covered with a thermoelectric material overcoat. A second substrate of thermoelectric material is then fused to the pointed tip side of the first substrate by, for example, heating the back of the first substrate to melt the thermoelectric material overcoat or by passing current through the pointed tips to induce Joule heating and thereby melt the thermoelectric material overcoat.

19 Claims, 10 Drawing Sheets

OTHER PUBLICATIONS

Smalley, Tubes@Rice, http://cnst.rice.edu/tubes/, Apr. 8, 1999, 8 pages.

Http://www.tellurex.com/resource/txfaqc.htm, Aug. 15, 1999, pp. 1–30.

Http://www.tellurex.com/resource/introc.htm, Aug. 15, 1999, pp. 1–7.

Liu et al., "Fullerene Pipes", www.sciencemag.org, *Science*, vol. 280, May 22, 1998, pp. 1253–1255.

Thess et al., "Crystalline Ropes of Metallic Carbon Nanotubes", *Science*, vol. 273, Jul. 26, 1996, pp. 483–487.

* cited by examiner

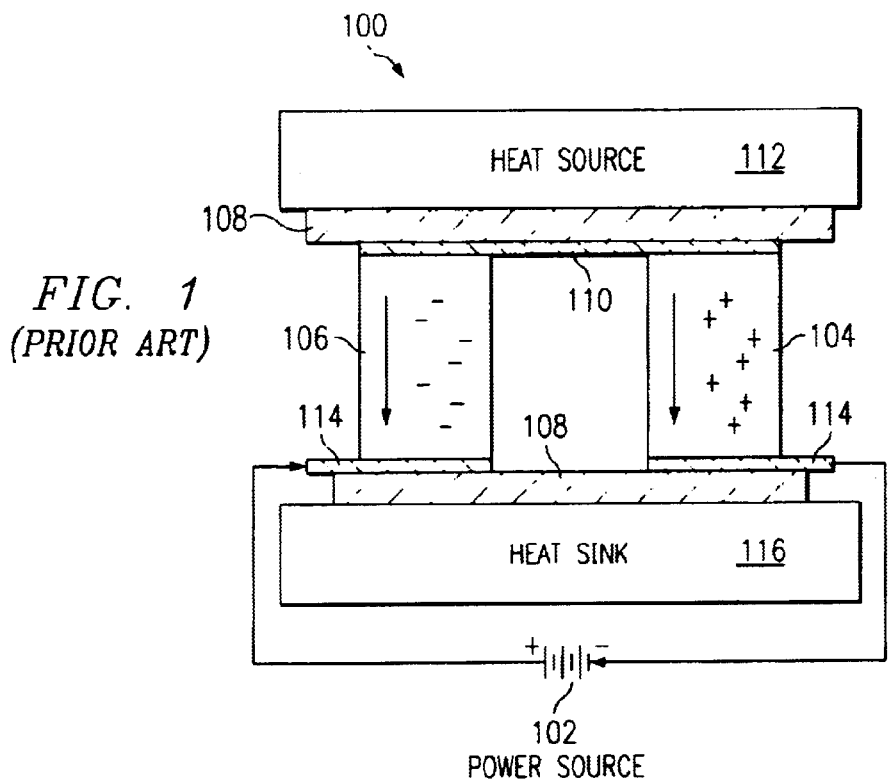
FIG. 1
(PRIOR ART)
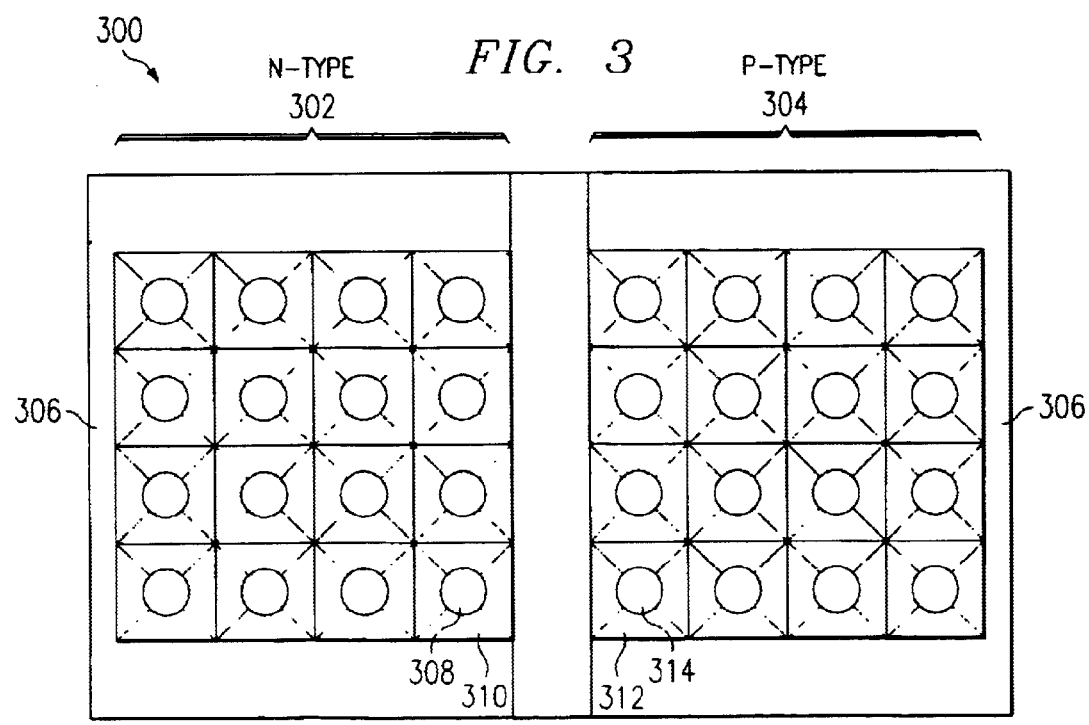

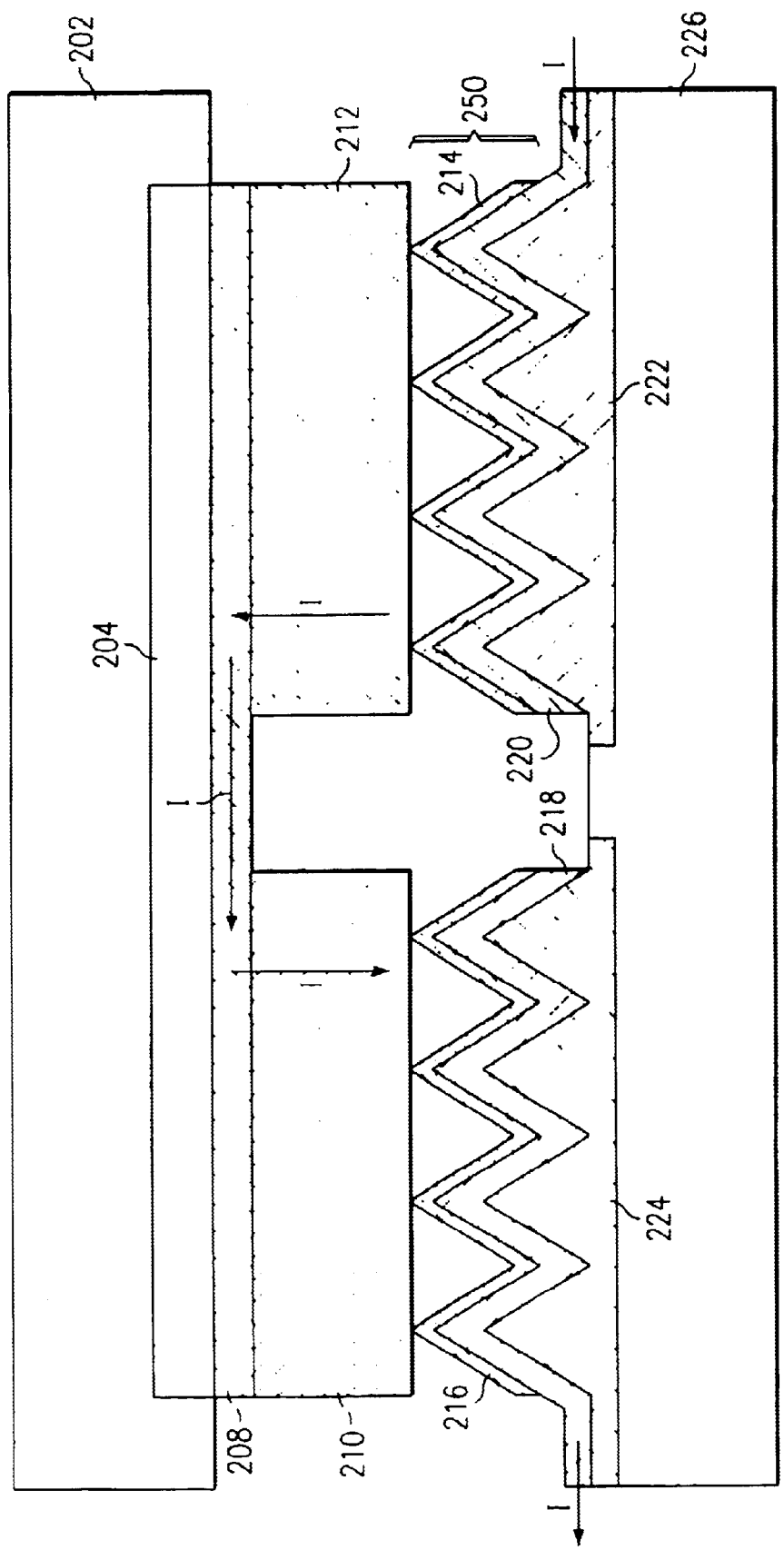

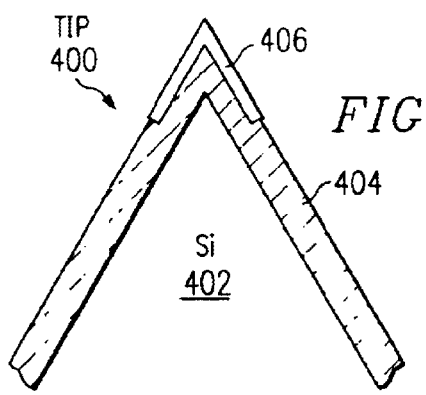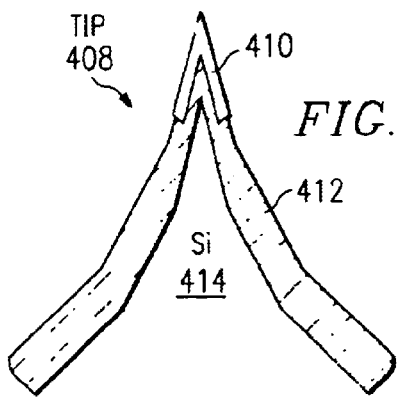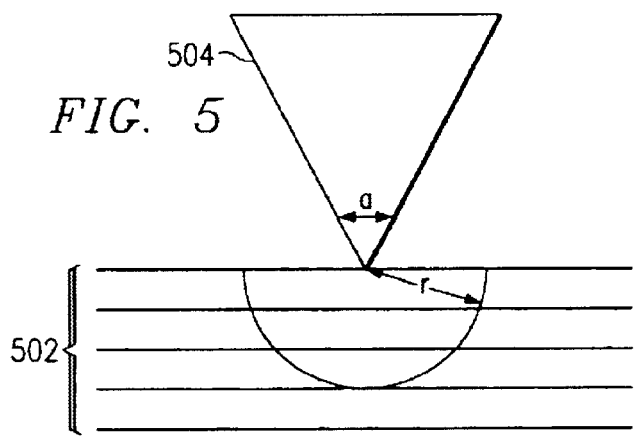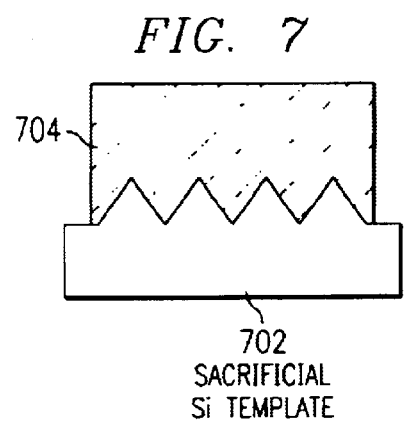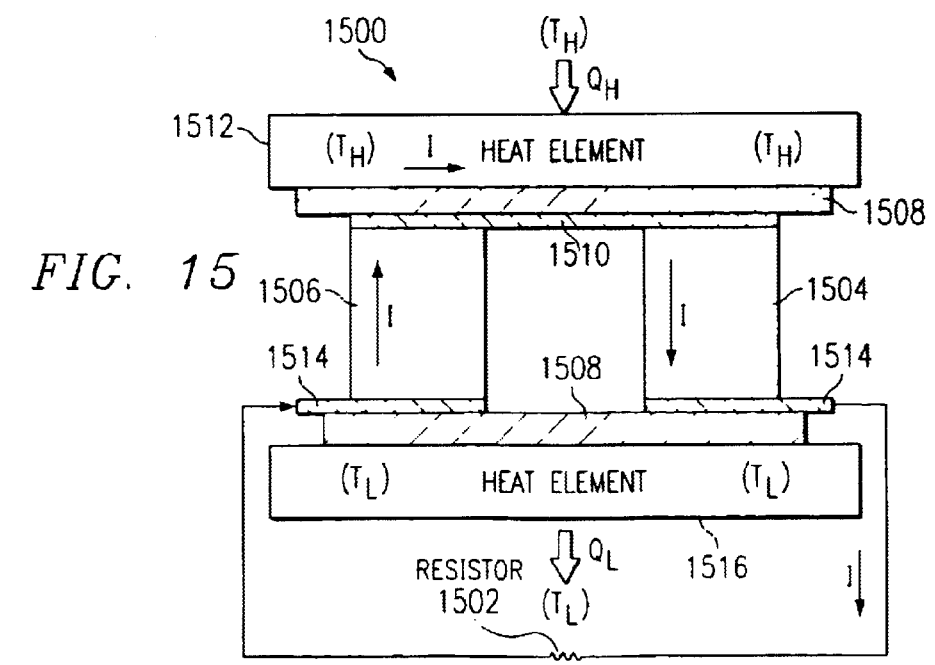

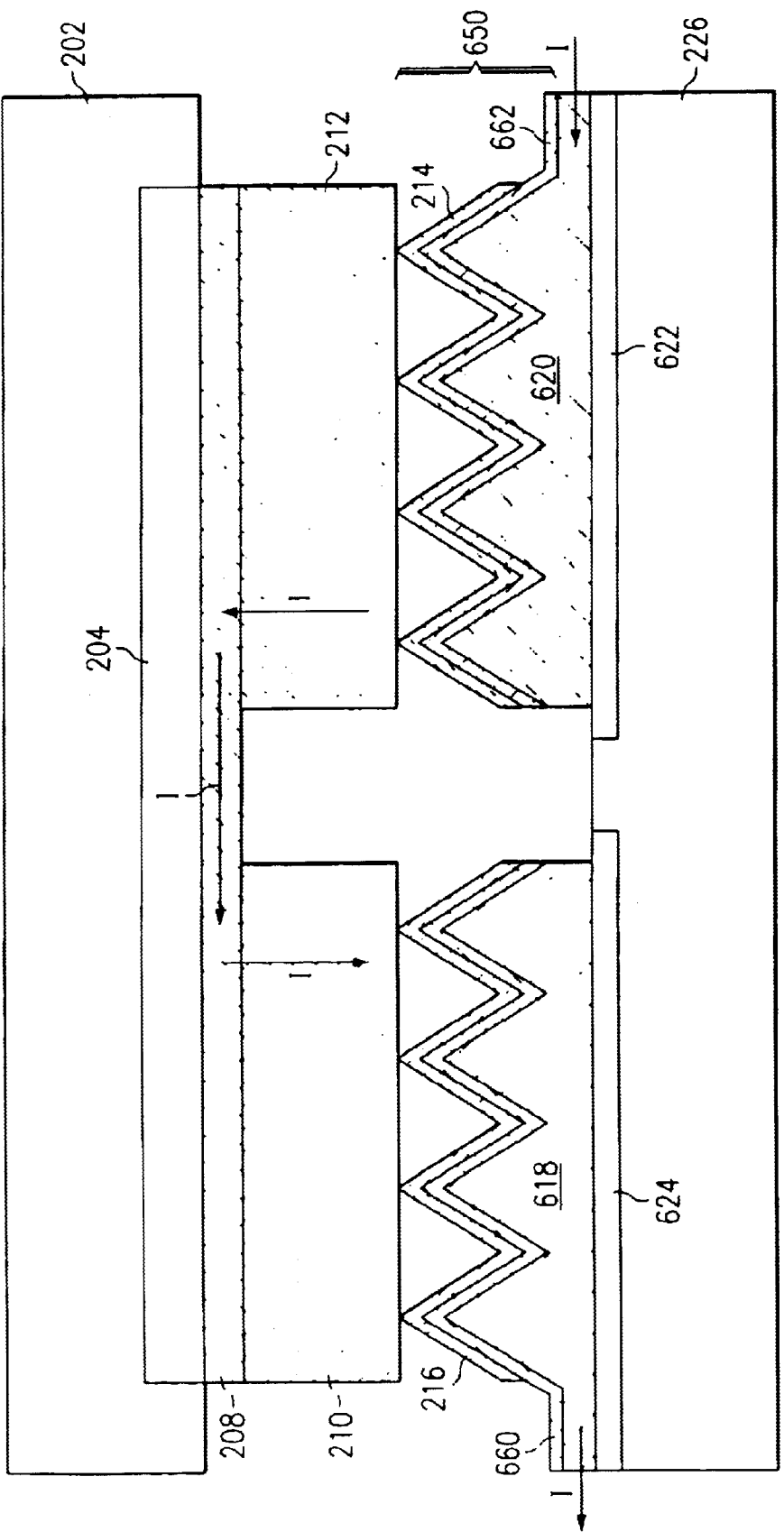

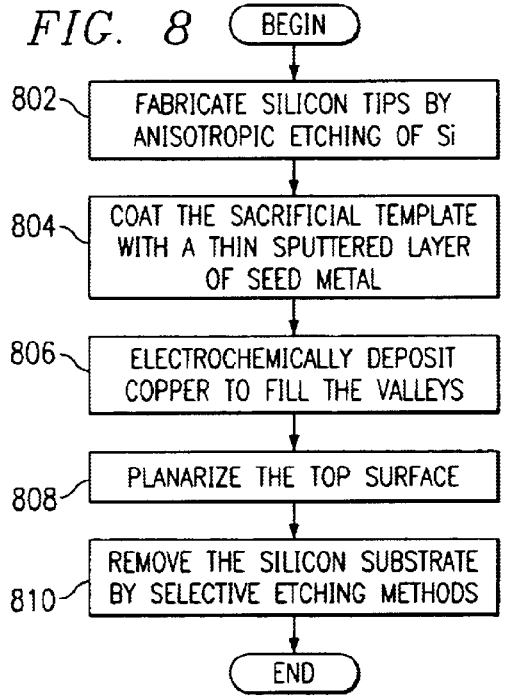
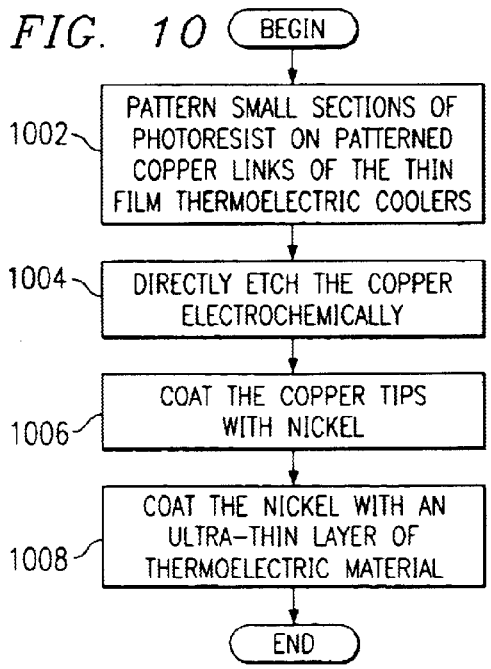
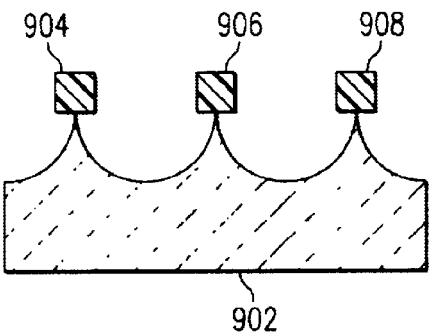
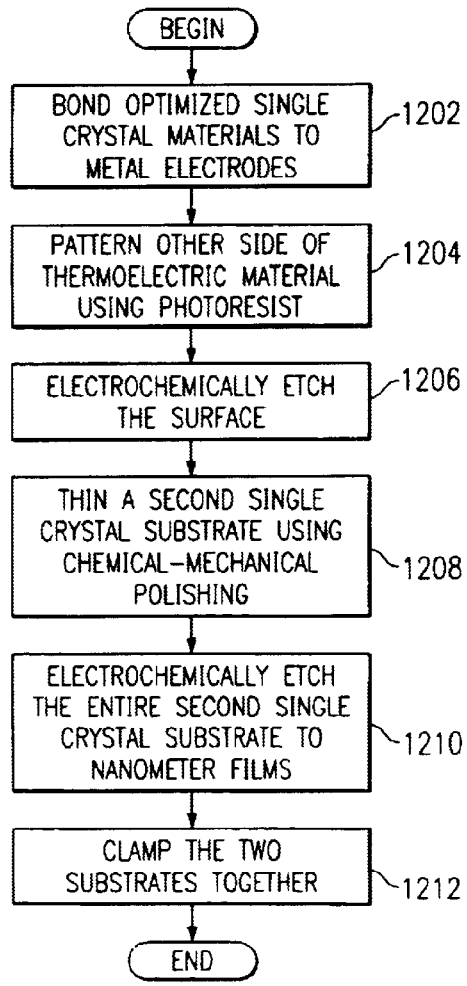

INTEGRATED QUANTUM COLD POINT COOLERS

BACKGROUND OF THE INVENTION

1. Technical Field

The present invention relates to devices for cooling substances such as, for example, integrated circuit chips, and more particularly, the present invention relates to thermoelectric coolers.

2. Description of Related Art

As the speed of computers continues to increase, the amount of heat generated by the circuits within the computers continues to increase. For many circuits and applications, increased heat degrades the performance of the computer. These circuits need to be cooled in order to perform most efficiently. In many low end computers, such as personal computers, the computer may be cooled merely by using a fan and fins for convective cooling. However, for larger computers, such as main frames, that perform at faster speeds and generate much more heat, these solutions are not viable.

Currently, many main-frames utilize vapor compression coolers to cool the computer. These vapor compression coolers perform essentially the same as the central air conditioning units used in many homes. However, vapor compression coolers are quite mechanically complicated requiring insulation and hoses that must run to various parts of the main frame in order to cool the particular areas that are most susceptible to decreased performance due to overheating.

A much simpler and cheaper type of cooler are thermoelectric coolers. Thermoelectric coolers utilize a physical principle known as the Peltier Effect, by which DC current from a power source is applied across two dissimilar materials causing heat to be absorbed at the junction of the two dissimilar materials. Thus, the heat is removed from a hot substance and may be transported to a heat sink to be dissipated, thereby cooling the hot substance. Thermoelectric coolers may be fabricated within an integrated circuit chip and may cool specific hot spots directly without the need for complicated mechanical systems as is required by vapor compression coolers.

However, current thermoelectric coolers are not as efficient as vapor compression coolers requiring more power to be expended to achieve the same amount of cooling. Furthermore, current thermoelectric coolers are not capable of cooling substances as greatly as vapor compression coolers. Therefore, a thermoelectric cooler with improved efficiency and cooling capacity would be desirable so that complicated vapor compression coolers could be eliminated from small refrigeration applications, such as, for example, main frame computers, thermal management of hot chips, RF communication circuits, magnetic read/write heads, optical and laser devices, and automobile refrigeration systems.

SUMMARY OF THE INVENTION

The present invention provides a method for forming a thermoelement for a thermoelectric cooler. In one embodiment a first substrate having a plurality of pointed tips separated by valleys wherein the substrate is covered by a metallic layer, portions of the metallic layer is covered by an insulator, and other portions of the metallic layer are exposed is formed. The other portions of the metallic layer that are exposed are covered with a thermoelectric material overcoat. A second substrate of thermoelectric material is then fused to the pointed tip side of the first substrate by, for example, heating the back of the first substrate to melt the thermoelectric material overcoat or by passing current through the pointed tips to induce Joule heating and thereby melt the thermoelectric material overcoat.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 depicts a high-level block diagram of a Thermoelectric Cooling (TEC) device in accordance with the prior art;

FIG. 2 depicts a cross sectional view of a thermoelectric cooler with enhanced structured interfaces in accordance with the present invention;

FIG. 3 depicts a planer view of thermoelectric cooler 200 in FIG. 2 in accordance with the present invention;

FIGS. 4A and 4B depicts cross sectional views of tips that may be implemented as one of tips 250 in FIG. 2 in accordance with the present invention;

FIG. 5 depicts a cross sectional view illustrating the temperature field of a tip near to a superlattice in accordance with the present invention;

FIG. 6 depicts a cross sectional view of a thermoelectric cooler with enhanced structured interfaces with all metal tips in accordance with the present invention;

FIG. 7 depicts a cross-sectional view of a sacrificial silicon template for forming all metal tips in accordance with the present invention;

FIG. 8 depicts a flowchart illustrating an exemplary method of producing all metal cones using a silicon sacrificial template in accordance with the present invention;

FIG. 9 depicts a cross sectional view of all metal cones formed using patterned photoresist in accordance with the present invention;

FIG. 10 depicts a flowchart illustrating an exemplary method of forming all metal cones using photoresist in accordance with the present invention;

FIG. 12 depicts a flowchart illustrating an exemplary method of fabricating a thermoelectric cooler in accordance with the present invention;

FIG. 15 depicts a schematic diagram of a thermoelectric power generator; and

DETAILED DESCRIPTION OF THE PREFERRED EMBODIMENT

Figure 11:
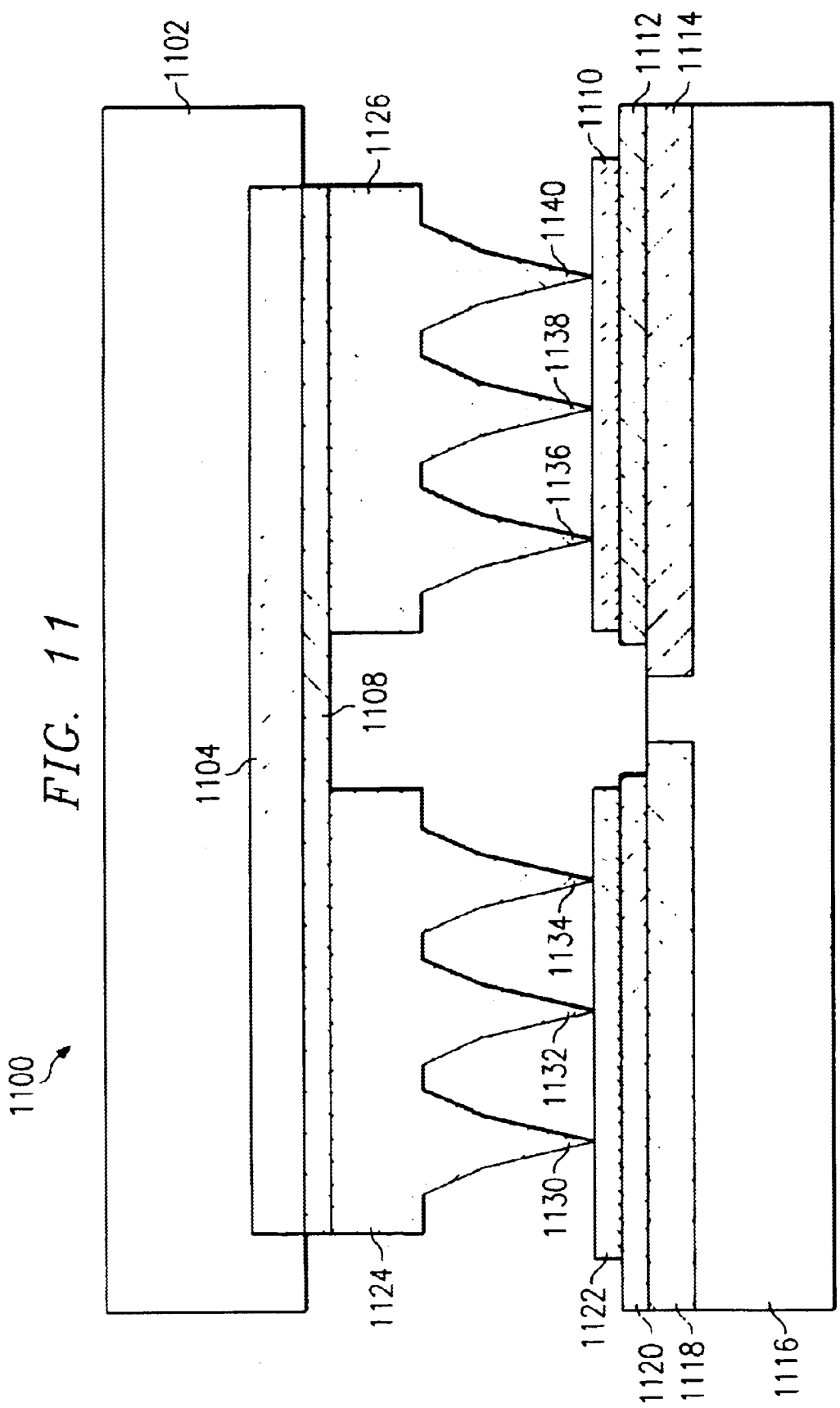
FIG. 11 depicts a cross-sectional view of a thermoelectric cooler with enhanced structural interfaces in which the thermoelectric material rather than the metal conducting layer is formed into tips at the interface in accordance with the present invention.

With reference now to the figures and, in particular, with reference to FIG. 1, a high-level block diagram of a Thermoelectric Cooling (TEC) device is depicted in accordance with the prior art. Thermoelectric cooling, a well known principle, is based on the Peltier Effect, by which DC current from power source 102 is applied across two dissimilar materials causing heat to be absorbed at the junction of the two dissimilar materials. A typical thermoelectric cooling device utilizes p-type semiconductor 104 and n-type semiconductor 106 sandwiched between poor electrical conductors 108 that have good heat conducting properties. N-type semiconductor 106 has an excess of electrons, while p-type semiconductor 104 has a deficit of electrons.

As electrons move from electrical conductor 110 to n-type semiconductor 106, the energy state of the electrons is raised due to heat energy absorbed from heat source 112. This process has the effect of transferring heat energy from heat source 112 via electron flow through n-type semiconductor 106 and electrical conductor 114 to heat sink 116. The electrons drop to a lower energy state and release the heat energy in electrical conductor 114.

The coefficient of performance, η, of a cooling refrigerator, such as thermoelectric cooler 100, is the ratio of the cooling capacity of the refrigerator divided by the total power consumption of the refrigerator. Thus the coefficient of performance is given by the equation:

$$\eta = \frac{\alpha I T_c - \frac{1}{2} I^2 R - K \Delta T}{I^2 R + \alpha I \Delta T}$$

where the term $\alpha I T_c$ is due to the thermoelectric cooling, the term $\frac{1}{2} I^2 R$ is due to Joule heating backflow, the term $K\Delta T$ is due to thermal conduction, the term $I^2 R$ is due to Joule loss, the term $\alpha I \Delta T$ is due to work done against the Peltier voltage, $\alpha$ is the Seebeck coefficient for the material, $T_c$ is the temperature of the heat source, and $\Delta T$ is the difference in the temperature of the heat source from the temperature of the heat sink.

The maximum coefficient of performance is derived by optimizing the current, I, and is given by the following relation:

$$\eta_{max} = \left(\frac{T_c}{\Delta T}\right) \left[\frac{\gamma - T_{ls}T_c}{\gamma + 1}\right]$$

where $$\gamma = \sqrt{1 + \frac{\alpha^2 \sigma}{\lambda}\left(\frac{T_h + T_c}{2}\right)}$$

and $$\varepsilon = \frac{\gamma - T_h T_c}{\gamma + 1}$$

where ε is the efficiency factor of the refrigerator. The figure of merit, ZT, is given by the equation:

$$ZT = \frac{\alpha^2 \sigma T}{\lambda}$$

where λ is composed of two components: $\lambda_e$, the component due to electrons, and $\lambda_L$, the component due to the lattice. Therefore, the maximum efficiency, ε, is achieved as the figure of merit, ZT, approaches infinity. The efficiency of vapor compressor refrigerators is approximately 0.3. The efficiency of conventional thermoelectric coolers, such as thermoelectric cooler 100 in FIG. 1, is typically less than 0.1. Therefore, to increase the efficiency of thermoelectric coolers to such a range as to compete with vapor compression refrigerators, the figure of merit, ZT, must be increased to greater than 2. If a value for the figure of merit, ZT, of greater than 2 can be achieved, then the thermoelectric coolers may be staged to achieve the same efficiency and cooling capacity as vapor compression refrigerators.

With reference to FIG. 2, a cross sectional view of a thermoelectric cooler with enhanced structured interfaces is depicted in accordance with the present invention. Thermoelectric cooler 200 includes a heat source 226 from which, with current I flowing as indicated, heat is extracted and delivered to heat sink 202. Heat source 226 may be thermally coupled to a substance that is desired to be cooled. Heat sink 202 may be thermally coupled to devices such as, for example, a heat pipe, fins, and/or a condensation unit to dissipate the heat removed from heat source 226 and/or further cool heat source 226.

Heat source 226 is comprised of p− type doped silicon. Heat source 226 is thermally coupled to n+ type doped silicon regions 224 and 222 of tips 250. N+ type regions 224 and 222 are electrical conducting as well as being good thermal conductors. Each of N+ type regions 224 and 222 forms a reverse diode with heat source 226 such that no current flows between heat source 226 and n+ regions 224 and 222, thus providing the electrical isolation of heat source 226 from electrical conductors 218 and 220.

Heat sink 202 is comprised of p− type doped silicon. Heat sink 202 is thermally coupled to n+ type doped silicon region 204. N+ type region 204 is electrically conducting and is a good thermal conductor. N+ type region 204 and heat sink 202 forms a reverse diode so that no current flows between the N+ type region 204 and heat sink 202, thus providing the electrical isolation of heat sink 202 from electrical conductor 208. More information about electrical isolation of thermoelectric coolers may be found in commonly U.S. Pat. No. 6,222,113, the contents of which are hereby incorporated herein for all purposes.

The need for forming reverse diodes with n+ and p− regions to electrically isolate conductor 208 from heat sink 202 and conductors 218 and 220 from heat source 226 is not needed if the heat sink 202 and heat source 226 are constructed entirely from undoped non-electrically conducting silicon. However, it is very difficult to ensure that the silicon is entirely undoped. Therefore, the presence of the reverse diodes provided by the n+ and p− regions ensures that heat sink 202 and heat source 226 are electrically isolated from conductors 208, 218, and 220. Also, it should be noted that the same electrical isolation using reverse diodes may be created other ways, for example, by using p+ type doped silicon and n− type doped silicon rather than the p− and n+ types depicted. The terms n+ and p+, as used herein, refer to highly n doped and highly p doped semiconducting material respectively. The terms n− and p−, as used herein, mean lightly n doped and lightly p doped semiconducting material respectively.

Thermoelectric cooler 200 is similar in construction to thermoelectric cooler 100 in FIG. 1. However, N-type 106 and P-type 104 semiconductor structural interfaces have been replaced with superlattice thermoelement structures 210 and 212 that are electrically coupled by doped region 204 and electrical conductor 208. Electrical conductor 208 may be formed from platinum (Pt) or, alternatively, from other conducting materials, such as, for example, tungsten (W), nickel (Ni), or titanium copper nickel (Ti/Cu/Ni) metal films.

A superlattice is a structure consisting of alternating layers of two different semiconductor materials, each several nanometers thick. Thermoelement 210 is constructed from alternating layers of N-type semiconducting materials and the superlattice of thermoelement 212 is constructed from alternating layers of P-type semiconducting materials. Each of the layers of alternating materials in each of thermoelements 210 and 212 is approximately 10 nanometers (nm) thick. A superlattice of two semiconducting materials has lower thermal conductivity, $\lambda$, and the same electrical conductivity, $\sigma$, as an alloy comprising the same two semiconducting materials.

In one embodiment, superlattice thermoelement 212 comprises alternating layers of p-type bismuth chalcogenide materials such as, for example, alternating layers of $Bi_2Te_3$/$Sb_2Te_3$ with layers of $Bi_{0.5}Sb_{1.5}Te_3$, and the superlattice of thermoelement 210 comprises alternating layers of n-type bismuth chalcogenide materials, such as, for example, alternating layers of $Bi_2Te_3$ with layers of $Bi_2Se_3$. Other types of semiconducting materials may be used for superlattices for thermoelements 210 and 212 as well. For example, rather than bismuth chalcogenide materials, the superlattices of thermoelements 210 and 212 may be constructed from cobalt antimony skutteridite materials.

Thermoelectric cooler 200 also includes tips 250 through which electrical current I passes into thermoelement 212 and then from thermoelement 210 into conductor 218. Tips 250 includes n+ type semiconductor 222 and 224 formed into pointed conical structures with a thin overcoat layer 218 and 220 of conducting material, such as, for example, platinum (Pt). Other conducting materials that may be used in place of platinum include, for example, tungsten (W), nickel (Ni), and titanium copper nickel (Ti/Cu/Ni) metal films. The areas between and around the tips 250 and thermoelectric materials 210 and 212 should be evacuated or hermetically sealed with a gas such as, for example, dry nitrogen.

On the ends of tips 250 covering the conducting layers 218 and 220 is a thin layer of semiconducting material 214 and 216. Layer 214 is formed from a P-type material having the same Seebeck coefficient, $\alpha$, as the nearest layer of the superlattice of thermoelement 212 to tips 250. Layer 216 is formed from an N-type material having the same Seebeck coefficient, $\alpha$, as the nearest layer of thermoelement 210 to tips 250. The P-type thermoelectric overcoat layer 214 is necessary for thermoelectric cooler 200 to function since cooling occurs in the region near the metal where the electrons and holes are generated. The n-type thermoelectric overcoat layer 216 is beneficial, because maximum cooling occurs where the gradient (change) of the Seebeck coefficient is maximum. The thermoelectric overcoats 214 and 216 are preferably in the range of 2–5 nanometers thick based upon present investigation.

By making the electrical conductors, such as, conductors 110 in FIG. 1, into pointed tips 250 rather than a planar interface, an increase in cooling efficiency is achieved. Lattice thermal conductivity, $\lambda$, at the point of tips 250 is very small because of lattice mismatch. For example, the thermal conductivity, $\lambda$, of bismuth chalcogenides is normally approximately 1 Watt/meter*Kelvin. However, in pointed tip structures, such as tips 250, the thermal conductivity is reduced, due to lattice mismatch at the point, to approximately 0.1 Watts/meter*Kelvin. However, the electrical conductivity of the thermoelectric materials remains relatively unchanged. Therefore, the figure of merit, ZT, may increased to greater than 2.5 for this kind of material. Another type of material that is possible for the superlattices of thermoelements 210 and 212 is cobalt antimony skutterridites. These type of materials typically have a very high thermal conductivity, $\lambda$, making them normally undesirable. However, by using the pointed tips 250, the thermal conductivity can be reduced to a minimum and produce a figure of merit, ZT, for these materials of greater than 4, thus making these materials very attractive for use in thermoelements 210 and 212.

Another advantage of the cold point structure is that the electrons are confined to dimensions smaller than the wavelength (corresponding to their kinetic energy). This type of confinement increases the local density of states available for transport and effectively increases the Seebeck coefficient. Thus, by increasing $\alpha$ and decreasing $\lambda$, the figure of merit ZT is increased.

Conventional thermoelectric coolers, such as illustrated in FIG. 1, are capable of producing a cooling temperature differential, $\Delta T$, between the heat source and the heat sink of around 60 Kelvin. However, thermoelectric cooler 200 is capable of producing a temperature differential greater than 100 Kelvin. Thus, with two thermoelectric coolers coupled to each other, cooling to temperatures in the range of liquid Nitrogen (less than 100 Kelvin) is possible. However, different materials may need to be used for thermoelements 210 and 212. For example, bismuth telluride has a very low $\alpha$ at low temperature (i.e. less than −100 degrees Celsius). However, bismuth antimony alloys perform well at low temperature.

Those of ordinary skill in the art will appreciate that the construction of the thermoelectric cooler in FIG. 2 may vary depending on the implementation taking into account the desired cooling, heat transfer capacity, current and voltage supplies. For example, more or fewer rows of tips 250 may be included than depicted in FIG. 1. The depicted example is not meant to imply architectural limitations with respect to the present invention.

With reference now to FIG. 3, a planer view of thermoelectric cooler 200 in FIG. 2 is depicted in accordance with the present invention. Thermoelectric cooler 300 includes an n-type thermoelectric material section 302 and a p-type thermoelectric material section 304. Both n-type section 302 and p-type section 304 include a thin layer of conductive material 306 that covers a silicon body.

Section 302 includes an array of conical tips 310 each covered with a thin layer of n-type material 308 of the same type as the nearest layer of the superlattice for thermoelement 210. Section 304 includes an array of conical tips 312 each covered with a thin layer of p-type material 314 of the same type as the nearest layer of the superlattice for thermoelement 212.

With reference now to FIGS. 4A and 4B, a cross sectional views of tips that may be implemented as one of tips 250 in FIG. 2 is depicted in accordance with the present invention. Tip 400 includes a silicon cone 402 that has been formed with a cone angle of approximately 35 degrees. A thin layer 404 of conducting material, such as platinum (Pt), overcoats the silicon 402. A thin layer of thermoelectric material 406 covers the very end of the tip 400. The cone angle after all layers have been deposited is approximately 45 degrees. The effective point radius of tip 400 is approximately 50 nanometers.

Tip 408 is an alternative embodiment of a tip, such as one of tips 250. Tip 408 includes a silicon cone 414 with a conductive layer 412 and thermoelectric material layer 410 over the point. However, tip 408 has a much sharper cone angle than tip 400. The effective point radius of tip 408 is approximately 10 nanometers. It is not known at this time whether a broader or narrower cone angle for the tip is preferable. In the present embodiment, conical angles of 45 degrees for the tip, as depicted in FIG. 4A, have been chosen, since such angle is in the middle of possible ranges of cone angle and because such formation is easily fabricated from silicon with a platinum overcoat. This is because a KOH etch along the <100> plane of silicon naturally forms a cone angle of 54 degrees. Thus, after the conductive and thermoelectric overcoats have been added, the cone angle is approximately 45 degrees.

With reference now to FIG. 5, a cross sectional view illustrating the temperature field of a tip near to a superlattice is depicted in accordance with the present invention. Tip 504 may be implemented as one of tips 250 in FIG. 2. Tip 504 has a effective tip radius at its sharpest point, a, of 10–50 nanometers. Thus, the temperature field is localized to a very small distance, r, approximately equal to 2 a or around 20–100 nanometers. Superlattice 502 need to be only a few layers thick to limit heat flow. Therefore, using pointed tips, a thermoelectric cooler with only 5–10 layers for the superlattice is sufficient.

Thus, fabricating a thermoelectric cooler, such as, for example, thermoelectric cooler 200, is simplified, since only a few layers of the superlattice must be formed. Also, thermoelectric cooler 200 can be fabricated very thin (on the order of 100 nanometers thick) as contrasted to conventional thermoelectric coolers which are on the order of 3 millimeters or greater in thickness.

Other advantages of a thermoelectric cooler with pointed tip interfaces in accordance with the present invention include minimization of the thermal conductivity through the thermoelements, such as thermoelements 210 and 212 in FIG. 2, because of the tip interfaces. Also, the temperature/potential drops are localized to an area near the tips, effectively allowing scaling to sub-100-nanometer lengths. Furthermore, using pointed tips minimizes the number layers needed for superlattice thermoelements 210 and 212. The present invention also permits electrodeposition of thin film structures. The smaller dimensions also allow for monolithic integration of n-type and p-type thermoelements.

The thermoelectric cooler of the present invention may be utilized to cool items, such as, for example, specific spots within a main frame computer, lasers, optic electronics, photodetectors, and PCR in genetics.

With reference now to FIG. 6, a cross sectional view of a thermoelectric cooler with enhanced structured interfaces with all metal tips is depicted in accordance with the present invention. Although the present invention has been described above as having tips 250 constructed from silicon cones constructed from the n+ semiconducting regions 224 and 222, tips 250 in FIG. 2 may be replaced by tips 650 as depicted in FIG. 6. Tips 650 have all metal cones 618 and 620. In the depicted embodiment, cones 618 and 620 are constructed from copper and have a nickel overcoat layer 660 and 662. Thermoelectric cooler 600 is identical to thermoelectric cooler 200 in all other respects, including having a thermoelectric overcoat 216 and 214 over the tips 650. Thermoelectric cooler 600 also provides the same benefits as thermoelectric cooler 200. However, by using all metal cones rather than silicon cones covered with conducting material, the parasitic resistances within the cones become very low, thus further increasing the efficiency of thermoelectric cooler 600 over the already increased efficiency of thermoelectric cooler 200. The areas surrounding the contact areas of tips 650 to thermoelectric materials 210 and 212 should be vacuum or hermetically sealed with a low-thermal conductivity gas, such as, for example, argon.

Also, as in FIG. 2, heat source 226 is comprised of p− type doped silicon. In contrast to FIG. 2, however, silicon heat source 226 is thermally coupled to n+ type doped silicon regions 624 and 622 but does not form part of the tipped structure 650 as did silicon regions 224 and 222 do in FIG. 2. N+ type doped silicon regions 624 and 622 do still perform the electrical isolation function performed by regions 224 and 222 in FIG. 2.

Several methods may be utilized to form the all metal cones as depicted in FIG. 6. For example, with reference now to FIG. 7, a cross-sectional view of a sacrificial silicon template that may be used for forming all metal tips is depicted in accordance with the present invention. After the sacrificial silicon template 702 has been constructed having conical pits, a layer of metal may be deposited over the template 702 to produce all metal cones 704. All metal cones 704 may then be used in thermoelectric cooler 600.

With reference now to FIG. 8, a flowchart illustrating an exemplary method of producing all metal cones using a silicon sacrificial template is depicted in accordance with the present invention. To begin, conical pits are fabricated by anisotropic etching of silicon to create a mold (step 802). This may be done by a combination of KOH etching, oxidation, and/or focused ion-beam etching. Such techniques of fabricating silicon pits are well known in the art.

The silicon sacrificial template is then coated with a thin sputtered layer of seed metal, such as, for example, titanium (step 804). Next, copper is electrochemically deposited to fill the valleys (conical pits) in the sacrificial silicon template. (step 806). The top surface of the copper is then planarized (step 808). Methods of planarizing a layer of metal are well known in the art. The silicon substrate is then removed by selective etching methods well known in the art (step 810). The all metal cones produced in this manner may then be covered with a coat of another metal, such as, for example, nickel, and then with an ultra-thin layer of thermoelectric material. The nickel overcoat aids in electrodeposition of the thermoelectric material overcoat.

One advantage to this method of producing all metal cones is that the silicon substrate mold is reusable if the copper is peeled from the silicon substrate as the separation process. The silicon substrate mold may be reused up to around 10 times before the mold degrades and becomes unusable.

Forming a template in this manner is very well controlled and produces very uniform all metal conical tips since silicon etching is very predictable and can calculate slopes of the pits and sharpness of the cones produced to a very few nanometers.

Other methods of forming all metal cones may be used as well. For example, with reference now to FIG. 9, a cross sectional view of all metal cones 902 formed using patterned photoresist is depicted in accordance with the present invention. In this method, a layer of metal is formed over the bottom portions of a partially fabricated thermoelectric cooler. A patterned photoresist 904–908 is then used to fashion all metal cones 902 with a direct electrochemical etching method. Often the tips are further sharpened by focused ion beam milling.

With reference now to FIG. 10, a flowchart illustrating an exemplary method of forming all metal cones using photoresist is depicted in accordance with the present invention. To begin, small sections of photoresist are patterned over a metal layer, such as copper, of a partially fabricated thermoelectric cooler (step 1002). The photoresist may be patterned in an array of sections having photoresist wherein each area of photoresist within the array corresponds to areas in which tips to the all metal cones are desired to be formed. The metal is then directly etched electrochemically (step 1004) to produce cones 902 as depicted in FIG. 9. The photoresist is then removed and the tips of the all metal cones may then be coated with another metal, such as, for example, nickel (step 1006). The second metal coating over the all metal cones may then be coated with an ultra-thin layer of thermoelectric material (step 1008). Thus, all metal cones with a thermoelectric layer on the tips may be formed which may used in a thermoelectric device, such as, for example, thermoelectric cooler 600. The all metal conical points produced in this manner are not as uniform as those produced using the method illustrated in FIG. 8. However, this method currently is cheaper and therefore, if cost is an important factor, may be a more desirable method.

The depicted methods of fabricating all metal cones are merely examples. Other methods may be used as well to fabricate all metal cones for use with thermoelectric coolers. Furthermore, other types of metals may be used for the all metal cone other than copper.

With reference now to FIG. 11, a cross-sectional view of a thermoelectric cooler with enhanced structural interfaces in which the thermoelectric material rather than the metal conducting layer is formed into tips at the interface is depicted in accordance with the present invention. Thermoelectric cooler 1100 includes a cold plate 1116 and a hot plate 1102, wherein the cold plate 1116 is in thermal contact with the substance that is to be cooled. Thermal conductors 1114 and 1118 provide a thermal couple between electrical conducting plates 1112 and 1120 respectively. Thermal conductors 1114 and 1118 are constructed of heavily n doped (n+) semiconducting material that provides electrical isolation between cold plate 1116 and conductors 1112 and 1120 by forming reverse biased diodes with the p− material of the cold plate 1116. Thus, heat is transferred from the cold plate 1116 through conductors 1112 and 1120 and eventually to hot plate 1102 from which it can be dissipated without allowing an electrical coupling between the thermoelectric cooler 1100 and the substance that is to be cooled. Similarly, thermal conductor 1104 provides a thermal connection between electrical conducting plate 1108 and hot plate 1102, while maintaining electrical isolation between the hot plate and electrical conducting plate 1108 by forming a reverse biased diode with the hot plate 1102 p− doped semiconducting material as discussed above. Thermal conductor 1104 is also an n+ type doped semiconducting material. Electrical conducting plates 1108, 1112, and 1120 are constructed from platinum (Pt) in this embodiment. However, other materials that are both electrically conducting and thermally conducting may be utilized as well. Also, it should be mentioned that the areas surrounding tips 1130–1140 proximate thermoelectric materials 1122 and 1110 should be evacuated to produce a vacuum or should be hermetically sealed with a low thermal conductivity gas, such as argon.

In this embodiment, rather than providing contact between the thermoelements and the heat source (cold end) metal electrode (conductor) through an array of points having metal in the point electrodes as in FIGS. 2 and 6, the array of points of contact between the thermoelement and the metal electrode is provided by an array of points 1130–1140 composed of thermoelements 1124 and 1126. The tips 1130–1140 of the present embodiment may be formed from single crystal or polycrystal thermoelectric materials by electrochemical etching.

In one embodiment, thermoelement 1124 is comprised of a super lattice of single crystalline $Bi_2Te_3/Sb_2Te_3$ and $Bi_{0.5}Sb_{1.5}Te_3$ and thermoelement 1126 is formed of a super lattice of single crystalline $Bi_2Te_3/Bi_2Se_3$ and $Bi_2Te_{2.0}Se_{0.1}$. Electrically conducting plate 1120 is coated with a thin layer 1122 of the same thermoelectric material as is the material of the tips 1130–1134 that are nearest thin layer 1120. Electrically conducting plate 1112 is coated with a thin layer 1110 of the same thermoelectric material as is the material of the tips 1136–1140 that are nearest thin layer 1112.

Figure 13:
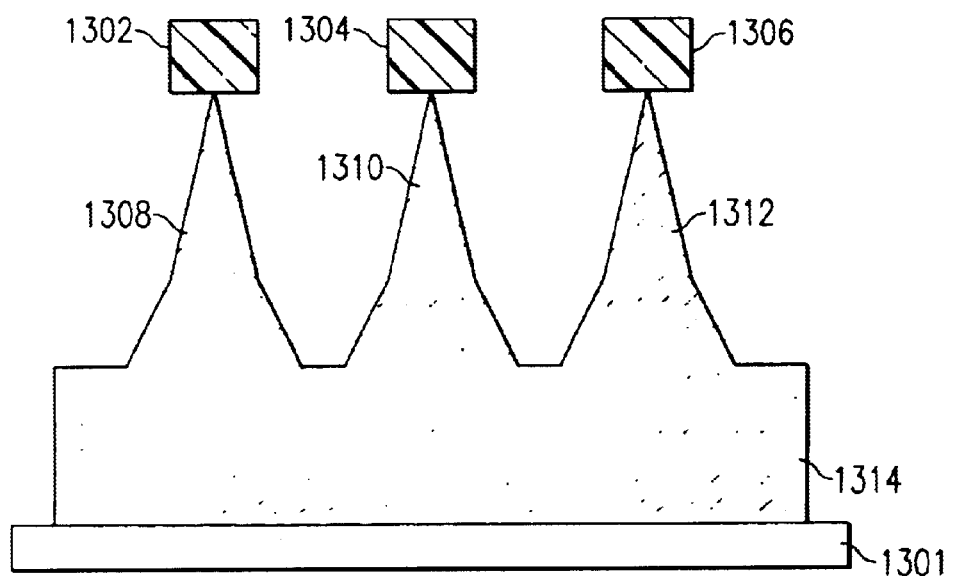
FIG. 13 depicts a cross-sectional diagram illustrating the positioning of photoresist necessary to produce tips in a thermoelectric material.

With reference now to FIG. 12, a flowchart illustrating an exemplary method of fabricating a thermoelectric cooler, such as, for example, thermoelectric cooler 1100 in FIG. 11, is depicted in accordance with the present invention. Optimized single crystal material is first bonded to a metal electrode 1301 by conventional means or the metal electrode is deposited onto the single crystal material to form the electrode connection pattern (step 1202) as depicted in FIG. 13. The other side of the thermoelectric material 1314 is then patterned (step 1204) by using photoresist 1302–1306 as a mask and the metal electrode as an anode in an electrochemical bath to etch the surface (step 1206). The tips 1308–1312 as depicted in FIG. 13 are formed by controlling and stopping the etching process at appropriate times.

A second single crystal substrate is thinned by chemical-mechanical polishing and then electrochemically etching the entire substrate to nanometer films (step 1210). The second ultra-thin substrate forms the cold end. The two substrates (the one with the ultra-thin thermoelectric material and the other with the thermoelectric tips) are then clamped together with light pressure (step 1212). This structure retains high crystallinity in all regions other than the interface at the tips. Also, similar methods can be used to fabricate polycrystalline structures rather than single crystalline structures.

Figure 14:
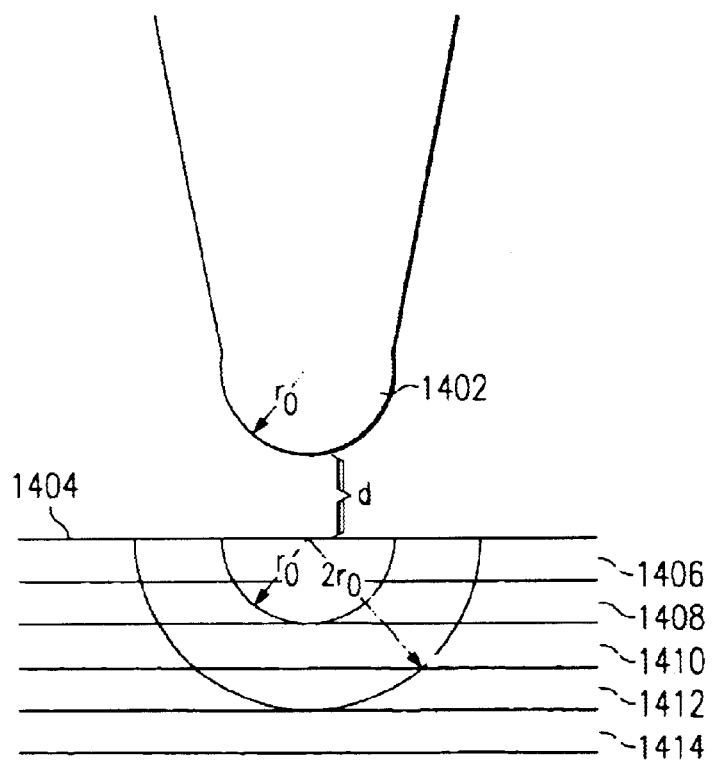
FIG. 14 depicts a diagram showing a cold point tip above a surface for use in a thermoelectric cooler illustrating the positioning of the tip relative to the surface in accordance with the present invention.

With reference now to FIG. 14, a diagram showing a cold point tip above a surface for use in a thermoelectric cooler illustrating the positioning of the tip relative to the surface is depicted in accordance with the present invention. Although the tips, whether created in as all-metal or metal coated tips or as thermoelectric tips have been described thus far as being in contact with the surface opposite the tips. However, although the tips may be in contact with the opposing surface, it is preferable that the tips be very near the opposing surface without fully touching the surface as depicted in FIG. 14. The tip 1402 in FIG. 14 is situated near the opposing surface 1404 but is not in physical contact with the opposing surface. Preferably, the tip 1402 should be a distance d on the order of 1 nanometer or less from the opposing surface 1404. In practice, with a thermoelectric cooler containing thousands of tips, some of the tips may be in contact with the opposing surface while others are not in contact due to the deviations from a perfect plane of the opposing surface.

By removing the tips from contact with the opposing surface, the thermal conductivity between the cold plate and the hot plate of a thermoelectric cooler may be reduced. Electrical conductivity is maintained, however, due to tunneling of electrons between the tips and the opposing surface.

The tips of the present invention have also been described and depicted primarily as perfectly pointed tips. However, as illustrated in FIG. 14, the tips in practice will typically have a slightly more rounded tip as is the case with tip 1402. However, the closer to perfectly pointed the tip is, the fewer number of superlattices needed to achieve the temperature gradient between the cool temperature of the tip and the hot temperature of the hot plate.

Preferably, the radius of curvature $r_0$ of the curved end of the tip 1402 is on the order of a few tens of nanometers. The temperature difference between successive layers of the thermoelectric material below surface 1404 approaches zero after a distance of two (2) to three (3) times the radius of curvature $r_0$ of the end of tip 1402. Therefore, only a few layers of the super lattice 1406–1414 are necessary. Thus, a superlattice material opposite the tips is feasible when the electrical contact between the hot and cold plates is made using the tips of the present invention. This is in contrast to the prior art in which to use a superlattice structure without tips, a superlattice of 10000 or more layers was needed to have a sufficient thickness in which to allow the temperature gradient to approach zero. Such a number of layers was impractical, but using only 5 or 6 layers as in the present invention is much more practical.

Although the present invention has been described primarily with reference to a thermoelectric cooling device (or Peltier device) with tipped interfaces used for cooling, it will be recognized by those skilled in the art that the present invention may be utilized for generation of electricity as well. It is well recognized by those skilled in the art that thermoelectric devices can be used either in the Peltier mode (as described above) for refrigeration or in the Seebeck mode for electrical power generation. Referring now to FIG. 15, a schematic diagram of a thermoelectric power generator is depicted. For ease of understanding and explanation of thermoelectric power generation, a thermoelectric power generator according to the prior art is depicted rather than a thermoelectric power generator utilizing cool point tips of the present invention. However, it should be noted that in one embodiment of a thermoelectric power generator according to the present invention, the thermoelements 1506 and 1504 are replaced cool point tips, as for example, any of the cool point tip embodiments as described in greater detail above.

In a thermoelectric power generator 1500, rather than running current through the thermoelectric device from a power source 102 as indicated in FIG. 1, a temperature differential, $T_H-T_L$, is created across the thermoelectric device 1500. Such temperature differential, $T_H-T_L$, creates a current flow, I, as indicated in FIG. 15 through a resistive load element 1502. This is the opposite mode of operation from the mode of operation described in FIG. 1

Therefore, other than replacing a power source 102 with a load resistor 1502 and maintaining heat elements 1512 and 1516 at differential temperatures $T_H$ and $T_L$ respectively with heat sources $Q_H$ and $Q_L$ respectively, thermoelectric device 1500 is identical in components to thermoelectric device 102 in FIG. 1. Thus, thermoelectric cooling device 1500 utilizes p-type semiconductor 1504 and n-type semiconductor 1506 sandwiched between poor electrical conductors 1508 that have good heat conducting properties. More information about thermoelectric electric power generation may be found in *CRC Handbook of Thermoelectrics*, edited by D. M. Rowe, Ph.D., D.Sc., CRC Press, N.Y., (1995) pp. 479–488 and in *Advanced Engineering Thermodynamics*, 2nd Edition, by Adiran Bejan, John Wiley & Sons, Inc., N.Y. (1997), pp. 675–682, both of which are hereby incorporated herein for all purposes.

Figure 16A:
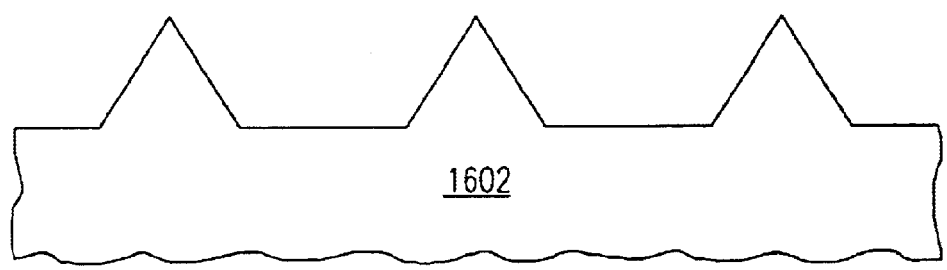
FIGS. 16A–16J depict cross sectional diagrams illustrating a process for fabricating thermoelements with pointed tip interfaces in accordance with the present invention.
Figure 16B:
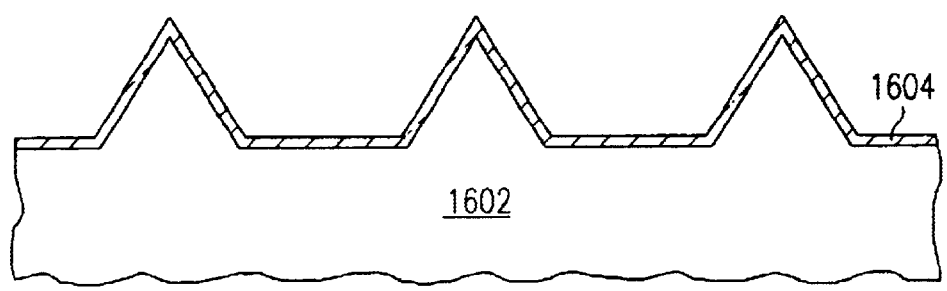
Figure 16C:
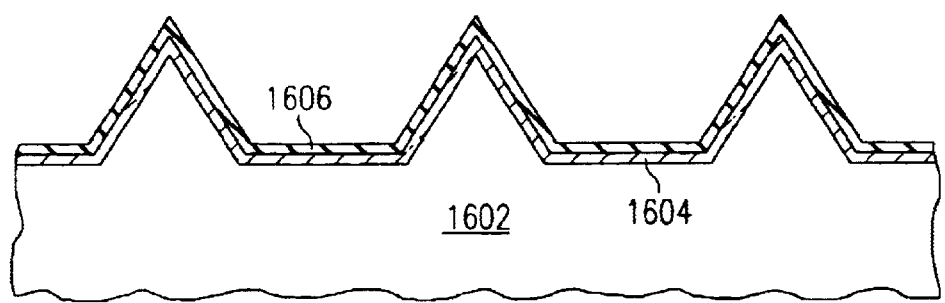
Figure 16D:
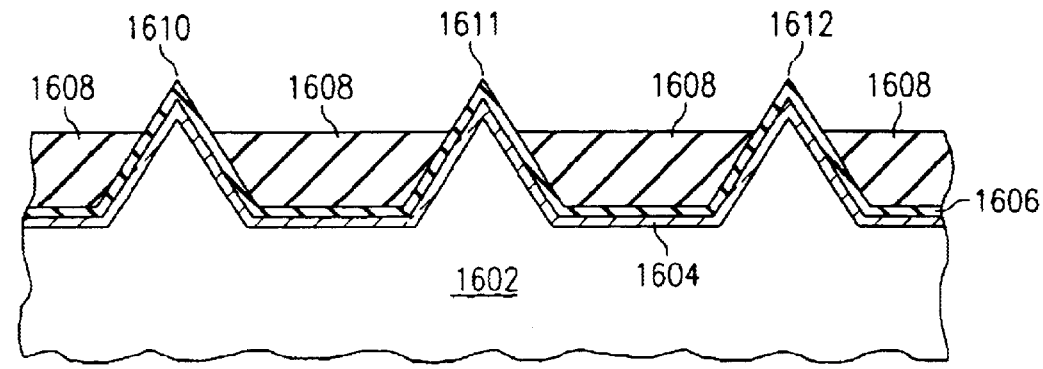

With reference now to FIGS. 16A–16J, cross sectional diagrams illustrating a process for fabricating thermoelements with pointed tip interfaces is depicted in accordance with the present invention. The thermoelements fabricated with this method may be used as thermoelements for a thermoelectric cooler such as, for example, thermoelectric cooler 200. To begin, a pointed tip substrate 1602 such as, for example, a silicon substrate or copper substrate peeled from silicon molds as described above, is formed as depicted in FIG. 16A. Next, the pointed tip substrate 1602 is coated with a metal layer 1604, such as, for example, titanium (Ti) or platinum (Pt), by, for example, a sputtering or an evaporation process, as depicted in FIG. 16B. A thin insulator 1606, such as, for example, silicon dioxide, is deposited over the metal layer 1604 as depicted in FIG. 16C. The valleys between tips 1610–1612 are filled with a sacrificial planarizing dielectric 1608 such that only the tips 1610–1612 of the metallic and insulator coated pointed tip substrate 1602 is exposed as depicted in FIG. 16D.

Figure 16E:
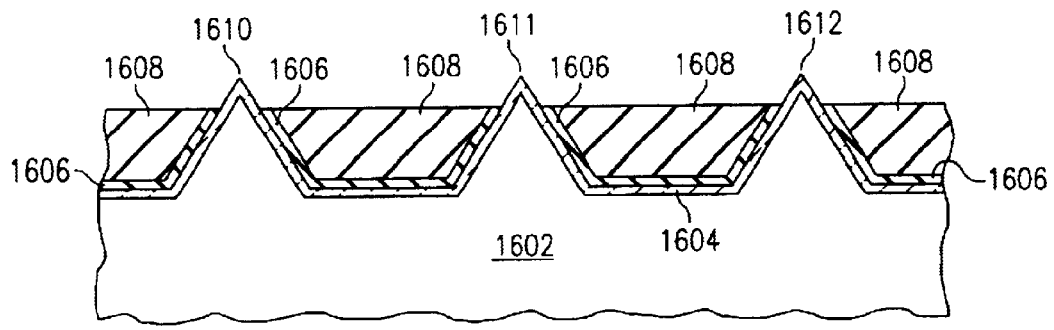
Figure 16F:
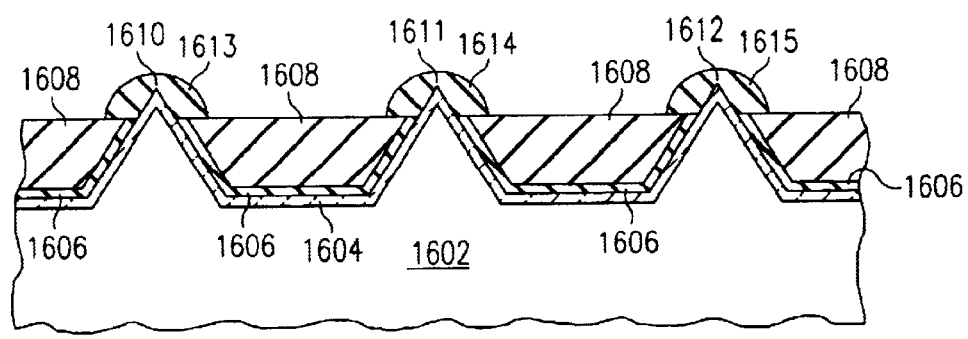
Figure 16G:
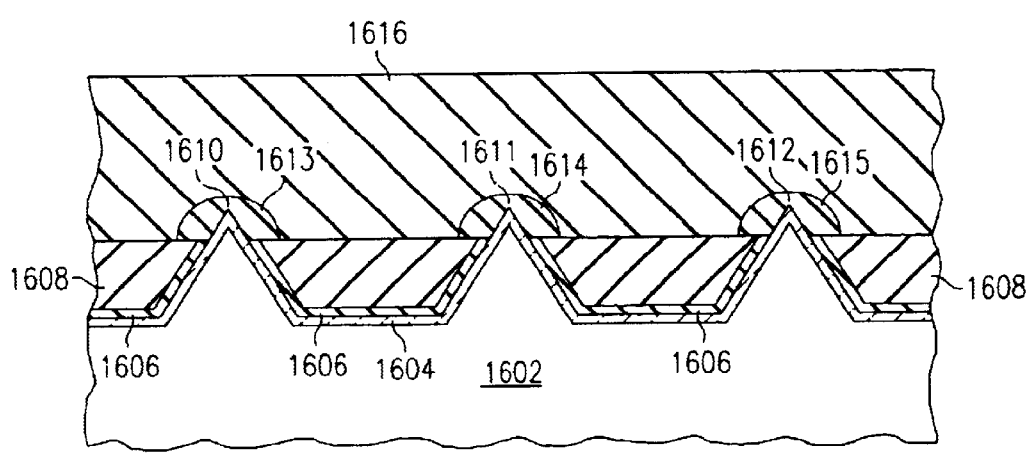
Figure 16H:
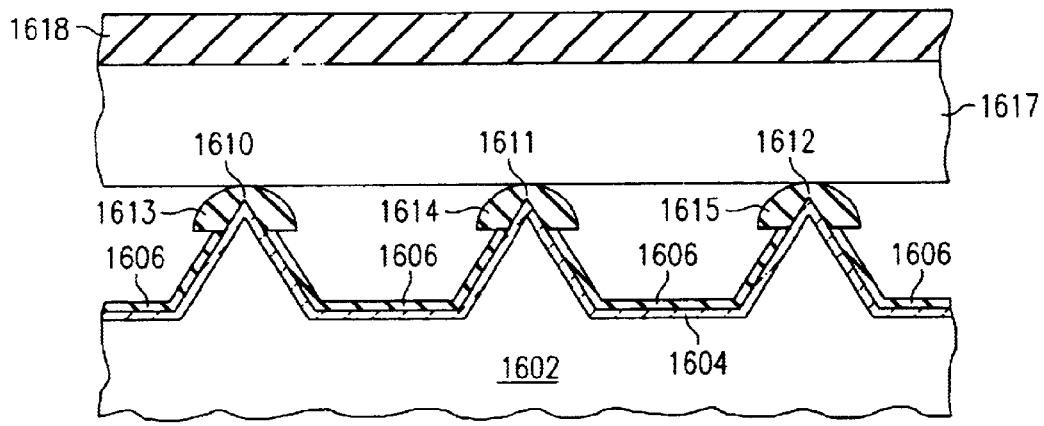
Figure 16I:
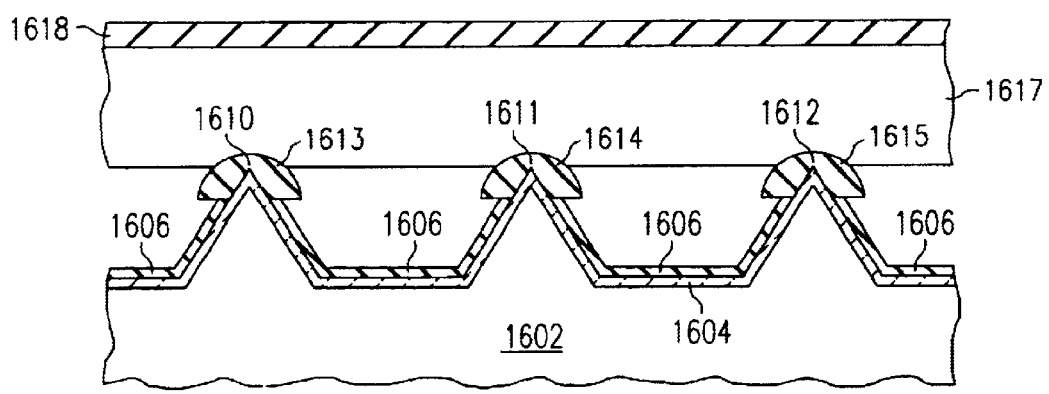
Figure 16J:
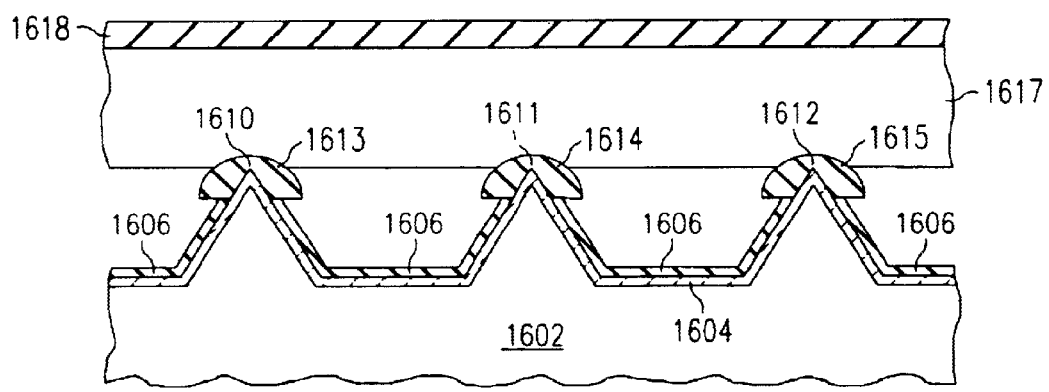

Next, the sacrificial dielectric 1608 and thin insulator 1606 are etched together until the tips 1610–1612 are exposed as depicted in FIG. 16E. A thermoelectric material overcoat 1613–1615 is then selectively grown by electrochemical methods or chemical vapor deposition (CVD) over the tips 1610–1612 to a thickness of approximately five (5) nanometers as depicted in FIG. 16F. The sacrificial dielectric 1608 is then removed as depicted in FIG. 16G. The pointed tip substrate 1602 with pointed tips 1610–1612 is mechanically aligned with a substantially flat surfaced thermoelectric substrate 1617 as depicted in FIG. 16H. The single crystal thermoelectric substrate 1617 is polished on one side 1619 and metallized by sputter deposition of Ni 1618 on the opposite side. The end of pointed tip substrate 1602 opposite pointed tips 1610–1612 is heated to approximately 550 degrees Celsius in order to melt the TE overcoats 1613–1615 and fuse the TE materials on the tips 1610–1612 to thermoelectric substrate 1617 as depicted in FIG. 16I. Alternatively, a current may be passed through the tips 1610–1612 to the point that Joule heat melts the thermoelectric material 1613–1615 near the tips 1610–1612 in order to fuse the tips 1610–1612 to thermoelectric substrate 1617.

The present invention has been described primarily with reference to conically shaped tips, however, other shapes of tips may be utilized as well, such as, for example, pyramidically shaped tips. In fact, the shape of the tip does not need to be symmetric or uniform as long as it provides a discrete set of substantially pointed tips through which electrical conduction between the two ends of a thermoelectric cooler may be provided. The present invention has applications to use in any small refrigeration application, such as, for example, cooling main frame computers, thermal management of hot chips and RF communication circuits, cooling magnetic heads for disk drives, automobile refrigeration, and cooling optical and laser devices.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for forming a thermoelement for a thermoelectric cooler, the method comprising:

forming a first substrate having a plurality of pointed tips covered by a metallic layer, portions of the metallic layer being covered by an insulating material, and other portions of the metallic layer being exposed;

covering portions of the metallic layer that are exposed with a thermoelectric material overcoat; and fusing a second substrate of thermoelectric material to the thermoelectric material overcoat.

2. The method as recited in claim 1, wherein forming a substrate having a plurality of pointed tips comprises:

forming a substrate having a plurality of pointed tips separated by valleys;

coating the substrate with a layer of metal;

coating the layer of metal with a layer of insulating material;

filling the valleys with a sacrificial material; and removing sacrificial and insulating material to expose the plurality of tips.

3. The method as recited in claim 1, wherein fusing the second substrate of thermoelectric material to the pointed tips comprises melting the thermoelectric material overcoat.

4. The method as recited in claim 3, wherein the thermoelectric material overcoat is melted by heating the first substrate.

5. The method as recited in claim 4, wherein the first substrate is heated to approximately 550 degrees Celsius.

6. The method as recited in claim 3, wherein the thermoelectric material overcoat is melted by passing a current through the tips in order to induce Joule heating of the thermoelectric material overcoat.

7. A system for forming a thermoelement for a thermoelectric cooler, the system comprising:

means for forming a first substrate having a plurality of pointed tips covered by a metallic layer, portions of the metallic layer being covered by an insulating material, and other portions of the metallic layer being exposed;

means for covering portions of the metallic layer that are exposed with a thermoelectric material overcoat; and means for fusing a second substrate of thermoelectric material to the thermoelectric material overcoat.

8. The system as recited in claim 7, wherein forming a substrate having a plurality of pointed tips separated by valleys comprises:

means for forming a substrate having a plurality of pointed tips separated by valleys;

means for coating the substrate with a layer of metal;

means for coating the layer of metal with a layer of insulating material;

means for filling the valleys with a sacrificial material; and means for removing sacrificial and insulating material to expose the plurality of tips.

9. The system as recited in claim 7, wherein fusing the second substrate of thermoelectric material to the pointed tips comprises melting the thermoelectric material overcoat.

10. The system as recited in claim 9, wherein the thermoelectric material overcoat is melted by heating the first substrate.

11. The system as recited in claim 10, wherein the first substrate is heated to approximately 550 degrees Celsius.

12. The system as recited in claim 9, wherein the thermoelectric material overcoat is melted by passing a current through the tips in order to induce Joule heating of the thermoelectric material overcoat.

13. A method for forming a thermoelement for use in a thermoelectric cooler, the method comprising:

forming a first substrate having a plurality of pointed tips covered with a thermoelectric overcoat;

fusing a second substrate of thermoelectric material to the pointed tips of the first substrate.

14. The method as recited in claim 13, wherein fusing the second substrate comprises:

mechanically aligning the second substrate to the pointed tips; and melting the thermoelectric overcoat.

15. The method as recited in claim 14, wherein the thermoelectric overcoat is melted by heating the first substrate.

16. The method as recited in claim 15, wherein the first substrate is heated to approximately 550 degrees Celsius.

17. The method as recited in claim 14, wherein the thermoelectric overcoat is melted by passing a electric current through the pointed tips to induce Joule heating of the thermoelectric overcoat.

18. A thermoelectric cooler, comprising:

a first substrate having a plurality of pointed tips, the apexes of the tips having a selectively deposited overcoat thermoelectric material;

a second substrate of planar thermoelectric material; and fused connections between the overcoat thermoelectric material and the planar thermoelectric material.

19. The thermoelectric cooler as recited in claim 18, wherein the planar thermoelectric material comprises a super lattice material.

* * * * *